United States Patent
Pan et al.

[11] Patent Number: 5,869,396
[45] Date of Patent: Feb. 9, 1999

[54] METHOD FOR FORMING A POLYCIDE GATE ELECTRODE

[75] Inventors: Yang Pan; Harianto Wong, both of Singapore, Singapore

[73] Assignee: Chartered Semiconductor Manufacturing Ltd., Singapore, Singapore

[21] Appl. No.: 679,974

[22] Filed: Jul. 15, 1996

[51] Int. Cl.⁶ .............................................. H01L 21/4763
[52] U.S. Cl. ...................... 438/647; 438/626; 438/645; 438/649
[58] Field of Search .................................. 437/195, 200; 438/253, 406, 459, 718, 720, 725, 624, 633, 692, 697, 699, 763, 626, 645, 647

[56] References Cited

U.S. PATENT DOCUMENTS

| | | | |
|---|---|---|---|
| 5,089,432 | 2/1992 | Yoo | 437/40 |
| 5,260,233 | 11/1993 | Buti et al. | 437/195 |
| 5,302,552 | 4/1994 | Duchateau et al. | 437/200 |
| 5,356,837 | 10/1994 | Geiss et al. | 437/200 |
| 5,382,533 | 1/1995 | Ahmad et al. | 437/24 |
| 5,457,069 | 10/1995 | Chen et al. | 437/190 |
| 5,674,783 | 10/1997 | Jang et al. | 438/697 |
| 5,726,102 | 3/1998 | Lo | 438/718 |

*Primary Examiner*—Charles L. Bowers, Jr.
*Assistant Examiner*—Reneé R. Berry
*Attorney, Agent, or Firm*—George O. Saile; Stephen B. Ackerman; Alek P. Szecsy

[57] ABSTRACT

A method for forming within a Field Effect Transistor (FET) for use within an integrated circuit a polycide gate electrode. There is first provided a semiconductor substrate. Formed upon the semiconductor is a patterned polysilicon layer. Formed then upon the semiconductor substrate and the patterned polysilicon layer is a blanket insulator layer. The blanket insulator layer is then patterned through planarizing to form a patterned planarized insulator layer while simultaneously exposing the surface of the patterned polysilicon layer. Finally, there is formed upon the exposed surface of the patterned polysilicon layer a patterned metal silicide layer. The patterned metal silicide layer and the patterned polysilicon layer form a polycide gate electrode. The metal silicide layer within the polycide gate electrode is not susceptible to encroachment upon adjoining insulator spacers or source/drain regions within the Field Effect Transistor (FET) within which is formed the polycide gate electrode.

25 Claims, 3 Drawing Sheets

METHOD FOR FORMING A POLYCIDE GATE ELECTRODE

BACKGROUND OF THE INVENTION

1. Field of the Invention

The present invention relates generally to gate electrodes employed within advanced Field Effect Transistors (FETs). More particularly, the present invention relates to a method for forming polycide gate electrodes employed within advanced Field Effect Transistors (FETs).

2. Description of the Related Art

Integrated circuits are formed upon semiconductor substrates within and upon whose surfaces are formed resistors, transistors, diodes and other electrical circuit elements. The electrical circuit elements are connected internally and externally to the semiconductor substrate upon which they are formed through patterned conductor layers which are separated by insulator layers.

As integrated circuit technology has advanced, there has been a continuing trend towards increasing levels of integrated circuit integration, integrated circuit performance and integrated circuit function. Within advanced integrated circuits within which there are formed Field Effect Transistors (FETs), such increasing levels of integrated circuit integration, integrated circuit performance and integrated circuit function have typically been achieved by simultaneously decreasing within those Field Effect Transistors (FETs) both the thicknesses of gate dielectric layers and the widths of semiconductor channel regions which are formed beneath those gate dielectric layers. The decreasing width of semiconductor channel regions within Field Effect Transistors (FETs) has in turn typically required a correlating decrease in areal dimensions of polysilicon gate electrodes which are conventionally employed as a masking element in defining within advanced Field Effect Transistors (FETs) the dimensions of semiconductor channel regions as well as the locations of source/drain regions which are separated by those semiconductor channel regions.

While the continuing increases in integration have successfully provided advanced generations of integrated circuits with increasing levels of performance and function, the continuing decreases in areal dimensions of polysilicon gate electrodes conventionally employed in forming Field Effect Transistors (FETs) within those advanced integrated circuits have required the use of polysilicon gate electrodes having low contact resistance layers formed upon their surfaces. The low contact resistance layers formed upon the polysilicon gate electrodes within advanced Field Effect Transistors (FETs) have typically been required in order to avoid contact resistance induced gate electrode electrical circuit delay which would otherwise result from higher contact resistance connections made directly to polysilicon gate electrodes of reduced areal dimension. The resulting polycide (polysilicon/metal silicide stack) gate electrodes have typically conventionally been formed as either a tungsten silicide polycide gate electrode or a titanium silicide polycide gate electrode, often through a self-aligned silicide (salicide) method which simultaneously provides corresponding tungsten silicide layers or titanium silicide layers upon the surfaces of adjoining source/drain regions of the Field Effect Transistor (FET) within which is formed the tungsten silicide polycide gate electrode or the titanium silicide polycide gate electrode. See, for example, Ahmad et al., U.S. Pat. No. 5,382,533, which illustrates the use of a tungsten silicide polycide gate electrode within a Field Effect Transistor (FET).

As areal dimensions of tungsten silicide polycide gate electrodes or titanium silicide polycide gate electrodes employed within Field Effect Transistors (FETs) have continued to decrease and define semiconductor channel regions beneath those tungsten silicide polycide gate electrodes or titanium silicide polycide gate electrodes of linewidth less than about 0.25 microns, the problem of contact resistance induced gate electrode electrical circuit delay again becomes important since the sheet resistances of both tungsten silicide layers and titanium silicide layers which define the contact resistances of both tungsten silicide polycide gate electrodes and titanium silicide polycide gate electrodes inherently increase dramatically at linewidths of less than about 0.25 microns. Thus, in order to avoid contact resistance induced gate electrode electrical circuit delay within integrated circuits having formed therein advanced Field Effect Transistors (FETs) with tungsten silicide polycide gate electrodes or titanium silicide polycide gate electrodes of linewidth less than about 0.25 microns, there has recently been proposed and implemented the use of polycide gate electrodes comprising cobalt silicide layers or nickel silicide layers rather than tungsten silicide layers or titanium silicide layers, since cobalt silicide and nickel silicide have an inherently lower contact resistance in comparison with either tungsten silicide or titanium silicide when formed in patterned layers of linewidth less than about 0.25 microns.

While the cobalt silicide polycide gate electrodes and nickel silicide polycide gate electrodes so formed have served well in providing gate electrodes exhibiting the decreased levels of contact resistance induced gate electrode electrical circuit delay desired within advanced integrated circuits, the methods through which such cobalt silicide polycide gate electrodes and nickel silicide polycide gate electrodes are formed within advanced Field Effect Transistors (FETs) are not entirely without problems. In particular, it is known in the art that the conventional self-aligned method for metal silicide layer formation within polycide gate electrodes, when employed for forming a cobalt silicide polycide gate electrode or nickel silicide polycide gate electrode, will typically yield a cobalt silicide layer or nickel silicide layer exhibiting substantial encroachment onto insulator spacers which adjoin the cobalt silicide polycide gate electrode or nickel silicide polycide gate electrode. Such encroachment may lead to electrical shorts between the cobalt silicide polycide gate electrode or the nickel silicide polycide gate electrode and the adjoining source/drain electrode regions which are separated by the insulator spacers, particularly under circumstances where the adjoining source/drain electrode regions also have simultaneously formed upon their surfaces self-aligned cobalt silicide layers or nickel silicide layers. It is thus in general towards the goal of forming within advanced Field Effect Transistors (FETs) cobalt silicide polycide gate electrodes, nickel silicide polycide gate electrodes and other metal silicide polycide gate electrodes which exhibit limited susceptibility to encroachment upon adjoining insulator spacers or source/drain regions that the present invention is directed.

Methods and materials through which may be formed within integrated circuits cobalt silicide layers and/or nickel silicide layers exhibiting desirable properties are known in the art. For example, Duchateau et al. in U.S. Pat. No. 5,302,552 disclose a method for forming without encroachment a self-aligned cobalt silicide layer or nickel silicide layer within an integrated circuit. The method employs annealing upon the exposed silicon portions of a silicon semiconductor substrate an amorphous alloy comprising cobalt or nickel in combination with an additional metal selected from the group of metals consisting of titanium, zirconium, tantalum, molybdenum, niobium and hafnium. In addition, Geiss et al. in U.S. Pat. No. 5,356,837 disclose a method for forming within a silicon semiconductor device an epitaxial cobalt silicide layer with limited susceptibility to agglomeration. The method employs annealing a silicon semiconductor device having formed thereover a bilayer comprising a cobalt layer formed over a refractory metal layer or a refractory metal silicide layer. Finally, Chen et al. in U.S. Pat. No. 5,457,069 disclose a method for forming within an integrated circuit a silicon semiconductor device having simultaneously formed thereover a titanium-tungsten barrier layer and a cobalt silicide layer or platinum silicide layer contacted shallow junction. The method employs forming and annealing upon the silicon semiconductor device a metal bilayer consisting of a lower metal layer comprising titanium metal alloyed with either cobalt metal or platinum metal, and an upper metal layer formed from tungsten.

Desirable in the art are additional methods and materials through which metal silicide layers such as cobalt silicide layers and nickel silicide layers may be formed within integrated circuits while exhibiting specific properties. Particular desirable are methods through which low resistance and high encroaching metal silicide layers such as cobalt silicide layers and nickel silicide layers when employed in forming polycide gate electrodes such as cobalt silicide polycide gate electrodes and nickel silicide polycide gate electrodes within Field Effect Transistors (FETs) within integrated circuits may be formed without encroachment of the low resistance and high encroaching metal silicide layers onto insulator spacers or source/drain regions adjoining the polycide gate electrodes formed with the low resistance and high encroaching metal silicide layers.

SUMMARY OF THE INVENTION

A first object of the present invention is to provide a method for forming within a Field Effect Transistor (FET) for use within an integrated circuit a low resistance polycide gate electrode employing a low resistance and high encroaching metal silicide layer such as a cobalt silicide layer or a nickel silicide layer.

A second object of the present invention is to provide a method in accord with the first object of the present invention wherein the low resistance and high encroaching metal silicide layer within the polycide gate electrode is not subject to encroachment upon insulator spacers or source/drain regions adjoining the low resistance polycide gate electrode within the Field Effect Transistor (FET).

A third object of the present invention is to provide a method in accord with the first object of the present invention and the second object of the present invention, which method is also readily manufacturable.

In accord with the objects of the present invention, there is provided by the present invention a method for forming within a Field Effect Transistor (FET) for use within an integrated circuit a polycide gate electrode. To practice the method of the present invention, there is first provided a semiconductor substrate. Formed upon the semiconductor substrate is a patterned polysilicon layer. Formed then upon the semiconductor substrate and the patterned polysilicon layer is a blanket insulator layer. The blanket insulator layer is then patterned through planarizing to form a patterned planarized insulator layer while simultaneously exposing the surface of the patterned polysilicon layer. Finally, there is formed upon the exposed surface of the patterned polysilicon layer a patterned metal silicide layer. The patterned metal silicide layer and the patterned polysilicon layer form the polycide gate electrode.

There is provided by the present invention a method for forming within a Field Effect Transistor (FET) for use within an integrated circuit a low resistance polycide gate electrode, where a low resistance and high encroaching metal silicide layer within the low resistance polycide gate electrode is not susceptible to encroachment upon insulator spacers or source/drain regions which adjoin the low resistance polycide gate electrode within the Field Effect Transistor (FET). Through the method of the present invention, the low resistance and high encroaching metal silicide layer within the low resistance polycide gate electrode is formed after forming and patterning of a blanket insulator layer to yield a patterned planarized insulator layer and an exposed surface of a patterned polysilicon layer which forms the lower layer of the low resistance polycide gate electrode. Since remaining portions of the patterned planarized insulator layer cover the insulator spacers and source/drain regions within the Field Effect Transistor (FET) within which is formed the low resistance polycide gate electrode through the method of the present invention, the low resistance and high encroaching metal silicide layer within the low resistance polycide gate electrode formed through the method of the present invention is not susceptible to encroachment upon those adjoining insulator spacers and source/drain regions.

The method of the present invention is readily manufacturable. The method of the present invention provides for forming a low resistance polycide gate electrode through a novel ordering of integrated circuit fabrication methods which are otherwise known in the art of integrated circuit fabrication. Since the ordering of the integrated circuit fabrication methods, rather than the existence of the individual integrated circuit fabrication methods, is unique to the method of the present invention, the method of the present invention is readily manufacturable.

BRIEF DESCRIPTION OF THE DRAWINGS

The objects features and advantages of the present invention are understood within the context of the Description of the Preferred Embodiments, as set forth below. The Description of the Preferred Embodiments is understood within the context of the accompanying drawings, which form a material part of this disclosure, wherein.

DESCRIPTION OF THE PREFERRED EMBODIMENTS

Figure 1:
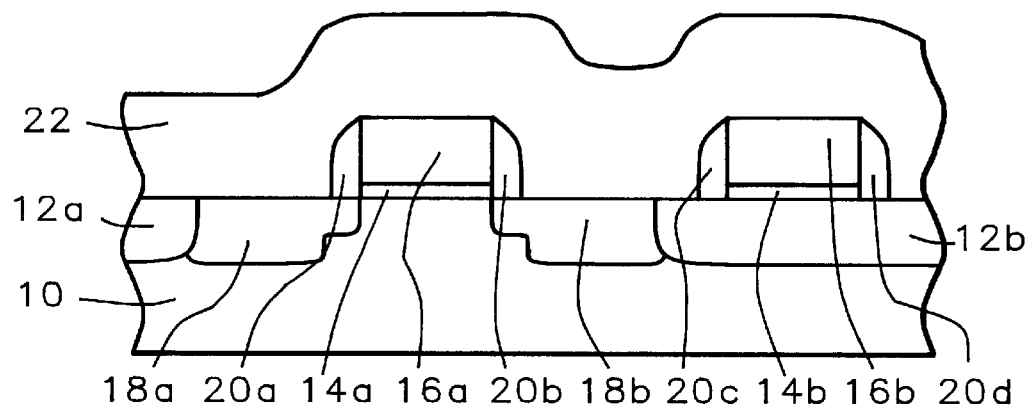
FIG. 1 to FIG. 4 show a series of schematic cross-sectional diagrams illustrating the results of progressive stages in forming within a Field Effect Transistor (FET) for use within an integrated circuit a cobalt silicide polycide gate electrode formed in accord with a first preferred embodiment of the method of the present invention.

The present invention provides a method for forming within a Field Effect Transistor (FET) for use within an integrated circuit a low resistance polycide gate electrode employing a low resistance and high encroaching metal silicide layer, where the low resistance and high encroaching metal silicide layer within the low resistance polycide gate electrode is not susceptible to encroachment upon insulator spacers or source/drain regions within the Field Effect Transistor (FET) within which is formed the low resistance polycide gate electrode. The manner by which the method of the present invention avoids encroachment of the low resistance and high encroaching metal silicide layer of the low resistance polycide gate electrode onto insulator spacers or source/drain regions adjoining the low resistance polycide gate electrode is through forming the low resistance and high encroaching metal silicide layer within the low resistance polycide gate electrode after forming a patterned planarized insulator layer which covers the insulator spacers and source/drain regions.

The method of the present invention may be employed in forming low resistance polycide gate electrodes within Field Effect Transistors (FETs) and Bipolar Complementary Metal Oxide Semiconductor (BiCMOS) transistors within various types of integrated circuits. The method of the present invention may be employed in forming low resistance polycide gate electrodes within Field Effect Transistors (FETs) and Bipolar Complementary Metal Oxide Semiconductor (BiCMOS) transistors within integrated circuits including but not limited to Dynamic Random Access Memory (DRAM) integrated circuits, Static Random Access Memory (SRAM) integrated circuits and Application Specific Integrated Circuits (ASICs). The method of the present invention has broad applicability in forming within Field Effect Transistors (FETs) and Bipolar Complementary Metal Oxide Semiconductor (BiCMOS) transistors within various types of integrated circuits low resistance polycide gate electrodes.

While the preferred embodiments of the method of the present invention disclose a low resistance polycide gate electrode employing a low resistance and high encroaching metal silicide layer formed from a cobalt silicide layer, the method of the present invention may also be employed in forming low resistance polycide gate electrodes employing a low resistance and high encroaching metal silicide layer other than the cobalt silicide layer. Such other low resistance and high encroaching metal silicide layers may include but are not limited to nickel silicide layers. Although the method of the present invention provides most value when the low resistance and high encroaching metal silicide layer employed in forming the low resistance polycide gate electrode exhibits substantial encroachment, the method of the present invention may nonetheless also be employed when forming a low resistance polycide gate electrode employing a low resistance and low encroaching metal silicide layer. The method of the present invention may nonetheless still provide value in forming a low resistance polycide gate electrode employing a low resistance and low encroaching metal silicide layer when the low resistance polycide gate electrode is of a sufficiently limited height such that the insulator spacers which separate the low resistance polycide gate electrode from source/drain regions within the Field Effect Transistor (FET) within which is formed the low resistance polycide gate electrode provide sufficiently limited separation from the source/drain regions such that even the low resistance and low encroaching metal silicide layer within the low resistance polycide gate electrode, when formed through a conventional self-aligned fashion, may form an electrical short to those source/drain regions.

Referring now to FIG. 1 to FIG. 4, there is shown a series of schematic cross-sectional diagrams illustrating the results of progressive process stages in forming within an integrated circuit a cobalt silicide polycide gate electrode in accord with a first preferred embodiment of the method of the present invention. Shown in FIG. 1 is a schematic cross-sectional diagram of the integrated circuit at its early stages of fabrication.

Shown in FIG. 1 is a semiconductor substrate 10 having formed within its surface isolation regions 12a and 12b which define the active region of the semiconductor substrate 10. Although semiconductor substrates are know in the art with either dopant polarity, many dopant concentrations and various crystallographic orientations, the semiconductor substrate 10 employed within the first preferred embodiment of the method of the present invention is preferably a (100) silicon semiconductor substrate having an N- or P-doping. Although it is also known in the art that isolation regions may be formed within and/or upon semiconductor substrates through several methods, including but not limited to isolation region growth methods and isolation region deposition/patterning methods, for the first preferred embodiment of the method of the present invention, the isolation regions 12a and 12b are preferably formed through backfilling and planarizing within shallow trenches excavated within the semiconductor substrate 10 a silicon oxide insulator layer formed through a Chemical Vapor Deposition (CVD) method. The method preferably provides silicon oxide isolation regions 12a and 12b of thickness about 1500 to about 3000 angstroms, the top surfaces of which silicon oxide isolation regions 12a and 12b are substantially planar with the surrounding surfaces of the semiconductor substrate 10.

Also shown within or upon the active region of the semiconductor substrate 10 as illustrated in FIG. 1 is the presence of several structures which are employed in forming a Field Effect Transistor (FET). The structures include: (1) a gate oxide layer 14a formed upon the active region of the semiconductor substrate 10; (2) a patterned polysilicon layer 16a formed and aligned upon the gate oxide layer 14a; (3) a pair of insulator spacers 20a and 20b formed along a pair of opposite edges of the patterned gate oxide layer 14a and the patterned polysilicon layer 16a; and (4) a pair of source/drain regions 18a and 18b incorporating a pair of Lightly Doped Drain (LDD) low dose ion implant structures formed within the active region of the semiconductor substrate 10 at areas not covered by the gate oxide layer 14a and the patterned polysilicon layer 16a. Each of the preceding structures employed in forming the Field Effect Transistor (FET) may be formed through methods and materials as are conventional in the art of forming Field Effect Transistors (FETs) within integrated circuits.

For example, the gate oxide layer 14a may be formed, through patterning, through plasma etch methods as are conventional in the art, of a blanket gate oxide layer formed upon the active region of the semiconductor substrate 10 through methods including but not limited to blanket gate oxide layer thermal growth methods and blanket gate oxide layer deposition methods. Preferably, the gate oxide layer 14a is formed to a thickness of about 40 to about 150 angstroms. In addition, the patterned polysilicon layer 16a is preferably formed through patterning, through plasma etch methods as are conventional in the art, of a blanket polysilicon layer formed upon the blanket gate oxide layer through a Chemical Vapor Deposition (CVD) method employing a suitable silicon source material along with a suitable dopant source material. Preferably, the patterned polysilicon layer 16a is formed to a thickness of from about 1000 to about 4000 angstroms. Preferably, the patterned polysilicon layer 16a has a linewidth of less than about 0.25 microns. Further, the insulator spacers 20a and 20b are preferably formed through anisotropic Reactive Ion Etch (RIE) etching, through methods as are conventional in the art, of a blanket layer of insulator spacer material formed upon the semiconductor substrate 10, the patterned gate oxide layer 14a and the patterned polysilicon layer 16a. Although insulator spacers may in general be formed of several insulator materials, including but not limited to silicon oxide insulator materials, silicon nitride insulator materials and silicon oxynitride insulator materials, the insulator spacers 20a and 20b formed through the first preferred embodiment of the method of the present invention are typically and preferably formed of a silicon oxide insulator material. Finally, as is common in the art, the source/drain regions 18a and 18b incorporating the Lightly Doped Drain (LDD) low dose ion implant structures are preferably formed within the active region of the semiconductor substrate 10 through a two-step ion implantation method employing a dopant of polarity suitable to the polarity of the Field Effect Transistor (FET) desired to be formed. Typically, the first step within the two-step ion implantation method forms the Lightly Doped Drain (LDD) low dose ion implant structure while employing the gate oxide layer 14a and the patterned polysilicon layer 16a as a mask, while the second step within the two-step ion implantation method provides the source/drain regions 18a and 18b incorporating the Lightly Doped Drain (LDD) low dose ion implant structures while employing the patterned gate oxide layer 14a, the patterned polysilicon layer 16a and the insulator spacers 20a and 20b as a mask. Preferably, the first step within the two-step ion implantation method is provided at an ion implantation dose of from about 1E13 to about 1E14 dopant ions per square centimeter and an ion implantation energy of from about 20 to about 100 keV. Preferably, the second step within the two-step ion implantation method is provided at an ion implantation dose of from about 1E15 to about 5E15 dopant ions per square centimeter also at an ion implantation energy of from about 20 to about 100 keV.

There is also, as shown in FIG. 1, formed upon the isolation region 12b a second gate oxide layer 14b having formed and aligned thereupon a second patterned polysilicon layer 16b, and a second pair of insulator spacers 20c and 20d formed along a pair of opposite edges of the second gate oxide layer 14a and the second patterned polysilicon layer 16b. The second patterned polysilicon layer 16b is typically employed as a polysilicon interconnect within the integrated circuit formed upon the semiconductor substrate 10. The second gate oxide layer 14b is preferably formed simultaneously with and through patterning of the same blanket gate oxide layer employed in forming the gate oxide layer 14a. In addition, the second patterned polysilicon layer 16b is preferably formed simultaneously with and through patterning of the same blanket polysilicon layer employed in forming the patterned polysilicon layer 16a. Finally, the second pair of insulator spacers 20c and 20d is preferably formed simultaneously with and through anisotropic Reactive Ion Etch (RIE) etching of the same blanket layer of insulator spacer material which is employed in forming the pair of insulator spacers 20a and 20b.

Finally, there is shown in FIG. 1 the presence of a blanket first Pre-Metal Dielectric (PMD) layer 22 formed upon the surface of the semiconductor substrate 10 including the structures employed in forming the Field Effect Transistor (FET) and the polysilicon interconnect. Methods and materials through which Pre-Metal Dielectric (PMD) layers may in general be formed within integrated circuits are known in the art of integrated circuit fabrication. Pre-Metal Dielectric (PMD) layers may be formed within integrated circuits through methods including but not limited to Chemical Vapor Deposition (CVD) methods, Plasma Enhanced Chemical Vapor Deposition (PECVD) methods and Physical Vapor Deposition (PVD) sputtering methods through which may be formed Pre-Metal Dielectric (PMD) layers of dielectric materials including but not limited to silicon oxide dielectric materials, silicon nitride dielectric materials and silicon oxynitride dielectric materials. For the first preferred embodiment of the method of the present invention, the blanket first Pre-Metal Dielectric (PMD) layer 22 is preferably a conformal silicon oxide dielectric layer formed of a silicon oxide dielectric material deposited within the integrated circuit whose schematic cross-sectional diagram is illustrated by FIG. 1 through a Plasma Enhanced Chemical Vapor Deposition (PECVD) method. Preferably, the blanket first Pre-Metal Dielectric (PMD) layer 22 so formed is from about 7000 to about 15000 angstroms thick.

Figure 2:
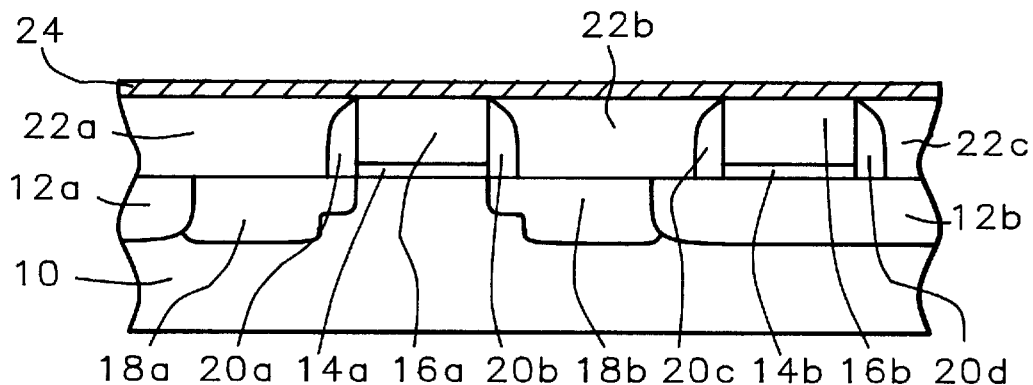

Referring now to FIG. 2, there is shown a schematic cross-sectional diagram illustrating the results of further processing of the integrated circuit whose schematic cross-sectional diagram is illustrated in FIG. 1. Shown in FIG. 2 are the patterned planarized first Pre-Metal Dielectric (PMD) layers 22a, 22b and 22c which are formed through planarizing, through methods as are conventional in the art, of the blanket first Pre-Metal Dielectric (PMD) layer 22. When planarizing the blanket first Pre-Metal Dielectric (PMD) layer 22 to form the patterned planarized first Pre-Metal Dielectric (PMD) layers 22a, 22b and 22c, the blanket first Pre-Metal Dielectric (PMD) layer 22 is planarized sufficiently such that the patterned polysilicon layers 16a and 16b are simultaneously exposed as the patterned planarized first Pre-Metal Dielectric layers 22a, 22b and 22c are formed. Although it is known in the art that dielectric layers may be planarized through methods including but not limited to Chemical Mechanical Polish (CMP) planarizing methods and Reactive Ion Etch (RIE) etch-back planarizing methods, for the first preferred embodiment of the method of the present invention, the blanket first Pre-Metal Dielectric (PMD) layer 22 is preferably planarized to simultaneously expose the patterned polysilicon layers 16a and 16b and form the patterned planarized Pre-Metal Dielectric (PMD) layers 22a, 22b and 22c through a Chemical Mechanical Polish (CMP) planarizing method.

There is also shown in FIG. 2 the presence of a blanket cobalt metal layer 24 formed upon the exposed surfaces of the blanket planarized first Pre-Metal Dielectric (PMD) layers 22a, 22b and 22c, and the patterned polysilicon layers 16a and 16b. Methods and materials through which blanket cobalt metal layers may be formed within integrated circuits are known in the art of integrated circuit fabrication. Blanket cobalt metal layers may be formed within integrated circuits through methods including but not limited to thermal evaporation methods, electron beam assisted evaporation methods, and Physical Vapor Deposition (PVD) sputtering methods employing cobalt source materials suitable to the individual methods. For the first preferred embodiment of the method of the present invention, the blanket cobalt metal layer 24 may be formed within the integrated circuit whose schematic cross-sectional diagram is illustrated in FIG. 2 through any of the foregoing methods. Preferably, the thickness of the blanket cobalt metal layer 24 is from about 200 to about 1000 angstroms.

Figure 3:
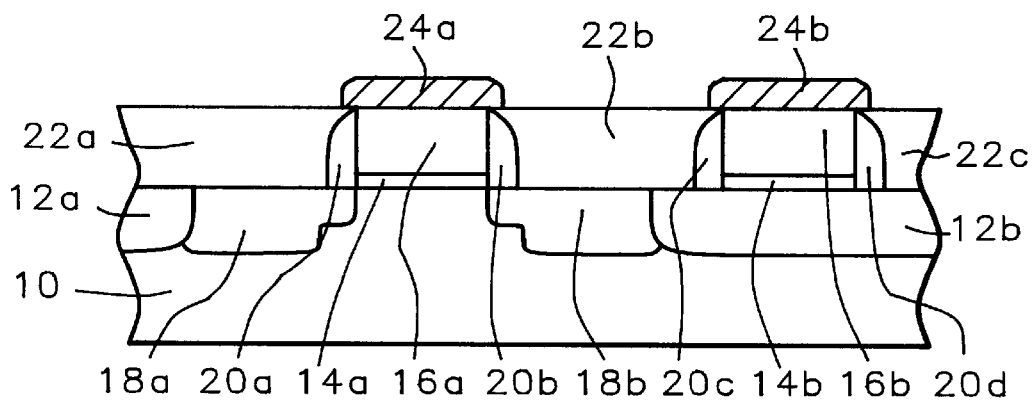

Referring now to FIG. 3, there is shown a schematic cross-sectional diagram illustrating the results of further processing of the integrated circuit whose schematic cross-sectional diagram is illustrated in FIG. 2. Shown in FIG. 3 is the results of thermally annealing the blanket cobalt metal layer 24 as illustrated in FIG. 2 to form the patterned self-aligned cobalt silicide layers 24a and 24b in contact with the patterned polysilicon layers 16a and 16b. Following formation of the patterned self-aligned cobalt silicide layers 24a and 24b, unreacted portions of the blanket cobalt metal layer 24 remaining upon the patterned planarized first Pre-Metal Dielectric (PMD) layers 22a, 22b and 22c are selectively removed. Methods through which portions of blanket cobalt metal layers in contact with patterned silicon containing layers within integrated circuits may be annealed to form patterned self-aligned cobalt silicide layers are known in the art of integrated circuit fabrication. Portions of blanket cobalt metal layers in contact with patterned silicon containing layers within integrated circuits may be annealed to form patterned self-aligned cobalt silicide layers through methods including but not limited to conventional thermal annealing methods and Rapid Thermal Annealing (RTA) methods employing intense heat sources for comparatively short time periods. For the first preferred embodiment of the method of the present invention, portions of the blanket cobalt metal layer 24 in contact with the patterned polysilicon layers 16a and 16b are preferably annealed to form the corresponding patterned self-aligned cobalt silicide layers 24a and 24b through a Rapid Thermal Annealing (RTA) method at a temperature of from about 500 to about 900 degrees centigrade for a time period of from about 10 to about 60 seconds. Following exposure to the Rapid Thermal Annealing (RTA) method through which is formed the patterned self-aligned cobalt silicide layers 24a and 24b, the remaining unreacted portions of the blanket cobalt metal layer 24 are preferably removed through etching with an etchant solution comprised of concentrated hydrochloric acid, concentrated hydrogen peroxide and deionized water at a $HCl:H_2O_2:H_2O$ volume ratio of about 1:1:6. Following removal of the remaining unreacted portions of the blanket cobalt metal layer 24, the patterned self-aligned cobalt silicide layers 24a and 24b are preferably re-annealed through exposure to a second Rapid Thermal Annealing (RTA) method at a temperature of from about 500 to about 900 degrees centigrade for a time period of from about 10 to about 60 seconds to fully optimize the contact resistance characteristics of the patterned self-aligned cobalt silicide layers 24a and 24b. Within the context of the methods and materials disclosed within the first preferred embodiment of the method of the present invention, the patterned self-aligned cobalt silicide layers 24a and 24b typically have a thickness of from about 200 to about 1500 angstroms each.

As is understood by a person skilled in the art, other methods for forming patterned cobalt silicide layers nominally equivalent to the patterned self-aligned cobalt silicide layers 24a and 24b may alternatively be employed in forming an integrated circuit whose schematic cross-sectional diagram is nominally equivalent to the integrated circuit whose schematic cross-sectional diagram is illustrated in FIG. 3. The other methods typically form patterned cobalt silicide layers through patterning of a blanket cobalt silicide layer independently formed in place of the blanket cobalt metal layer 24 illustrated in FIG. 2. Such other methods for forming patterned cobalt silicide layers are typically not preferred since they involve additional masking methods providing additional process complexity and the potential for mis-registration of the patterned cobalt silicide layers upon the patterned polysilicon layers 16a and 16b.

Together, the patterned self-aligned cobalt silicide layer 24a and the patterned polysilicon layer 16a form a cobalt silicide polycide gate electrode formed through the first preferred embodiment of the method of the present invention. The patterned self-aligned cobalt silicide layer 24a within the cobalt silicide polycide gate electrode so formed is not susceptible to encroachment onto the insulator spacers 20a and 20b or the source/drain regions 18a and 18b adjoining the cobalt silicide polycide gate electrode since the insulator spacers 20a and 20b and the source/drain regions 18a and 18b have formed thereupon the corresponding patterned planarized first Pre-Metal Dielectric (PMD) layers 22a and 22b. Thus, although there may be some encroachment of the patterned cobalt silicide layer 24a upon the surfaces of the patterned planarized Pre-Metal Dielectric (PMD) layers 22a and 22b, there will be no electrical shorting of the patterned self-aligned cobalt silicide layer 24a to the source/drain regions 18a and 18b.

Figure 4:
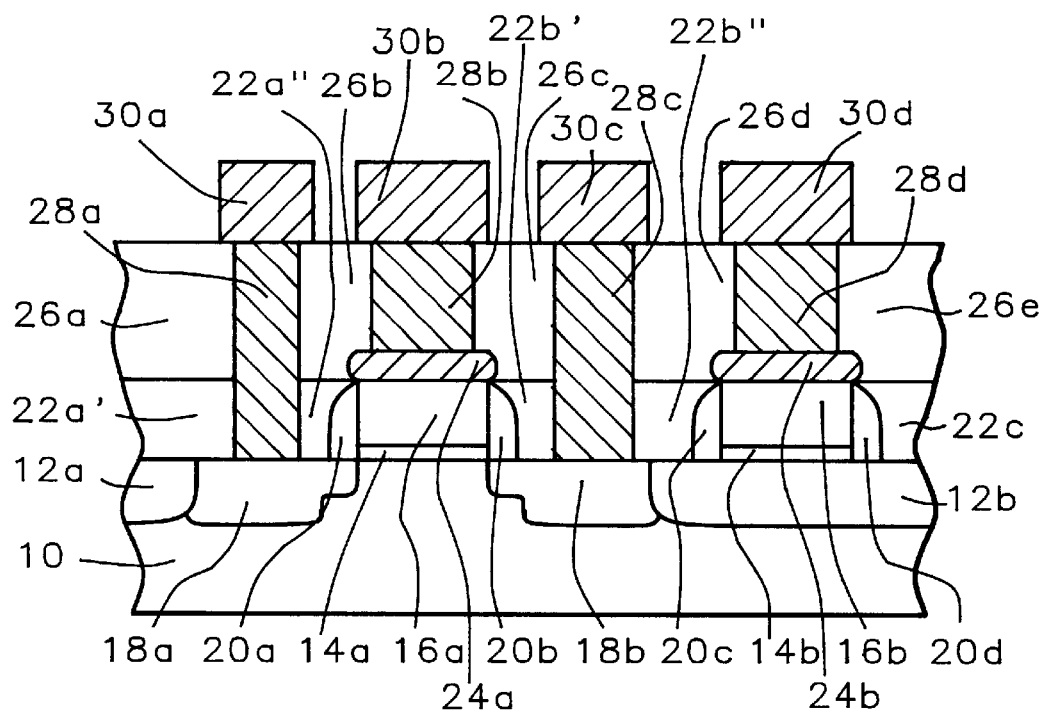

Referring now to FIG. 4, there is shown a schematic cross-sectional diagram illustrating the results of further processing of the integrated circuit whose schematic cross sectional diagram is illustrated in FIG. 3. Shown in FIG. 4 is the presence of the patterned second Pre-Metal Dielectric (PMD) layers 26a, 26b, 26c, 26d and 26e which are formed upon the surface of the integrated circuit whose schematic cross-sectional diagram is illustrated in FIG. 3. Although alternative methods and materials may also be employed, the patterned second Pre-Metal Dielectric (PMD) layers 26a, 26b, 26c, 26d and 26e are preferably formed through methods and materials analogous to the methods and materials employed in forming the patterned planarized first Pre-Metal Dielectric (PMD) layers 22a, 22b and 22c. Through the method of forming the patterned second Pre-Metal Dielectric (PMD) layers 26a, 26b, 26c, 26d and 26e, there is also included an etch patterning method for forming a series of apertures which individually reach the surfaces of the source/drain region 18a, the patterned self-aligned cobalt silicide layer 24a, the source/drain region 18b and the patterned self-aligned cobalt silicide layer 24b. Through this etch patterning method there is simultaneously formed from the patterned planarized first Pre-Metal Dielectric (PMD) layer 22a the etched patterned planarized first Pre-Metal Dielectric (PMD) layers 22a' and 22a", and there is also formed from the patterned planarized first Pre-Metal Dielectric layer 22b the etched patterned planarized first Pre-Metal Dielectric layers 22b' and 22b".

Also shown in FIG. 4 is the presence of conductive contact studs 28a, 28b, 28c and 28d formed into the apertures between the patterned second Pre-Metal Dielectric (PMD) layers 26a, 26b, 26c, 26d and 26e simultaneously making contact with the corresponding surfaces of the source/drain region 18a, the patterned self-aligned cobalt silicide layer 24a, the source/drain region 18b and the patterned self-aligned cobalt silicide layer 24b. Methods and materials through which conductive contact studs may be formed within integrated circuits are known within the art of integrated circuit fabrication. Conductive contact studs may be formed within integrated circuits through methods including but not limited to thermal evaporation methods, Chemical Vapor Deposition (CVD) methods and Physical Vapor Deposition (PVD) sputtering methods through which may be formed conductive contact studs of conductive materials including but not limited to metals, metal alloys and highly doped polysilicon. For the first preferred embodiment of the method of the present invention, the conductive contact studs 28a, 28b, 28c and 28d are preferably formed at least in part of tungsten metal deposited through a Chemical Vapor Deposition (CVD) method, as is common in the art. The conductive contact studs 28a, 28b, 28c and 28d are preferably formed of a sufficient thickness to reach the upper surfaces of the patterned second Pre-Metal Dielectric (PMD) layers 26a, 26b, 26c, 26d and 26e.

Finally, there is shown in FIG. 4 the presence of patterned first conductor layers 30a, 30b, 30c and 30d which are formed contacting the corresponding conductive contact studs 28a, 28b, 28c and 28d. Methods and materials through which patterned conductor layers may be formed within integrated circuits are known within the art of integrated circuit fabrication. Patterned conductor layers are typically formed within integrated circuits through patterning through methods as are conventional in the art of blanket conductor layers formed within integrated circuits. For the first preferred embodiment of the method of the present invention, the patterned first conductor layers 30a, 30b, 30c and 30d are preferably formed through patterning through methods as are conventional in the art of a blanket first conductor layer formed at least in part of an aluminum containing conductor alloy, as is common in the art. Preferably, the patterned first conductor layers 30a, 30b, 30c and 30d are from about 4000 to about 8000 angstroms thick each.

In addition to the first preferred embodiment of the method of the present invention, there also exists a second preferred embodiment of the method of the present invention. A series of schematic cross-sectional diagrams which illustrates the results of progressive process stages in forming within a Field Effect Transistor (FET) within an integrated circuit a cobalt silicide polycide gate electrode in accord with the second preferred embodiment of the method of the present invention is shown by reference to FIG. 5 to FIG. 7. Shown in FIG. 7 is a schematic cross-sectional diagram of the integrated circuit at its early stages of fabrication.

Figure 5:
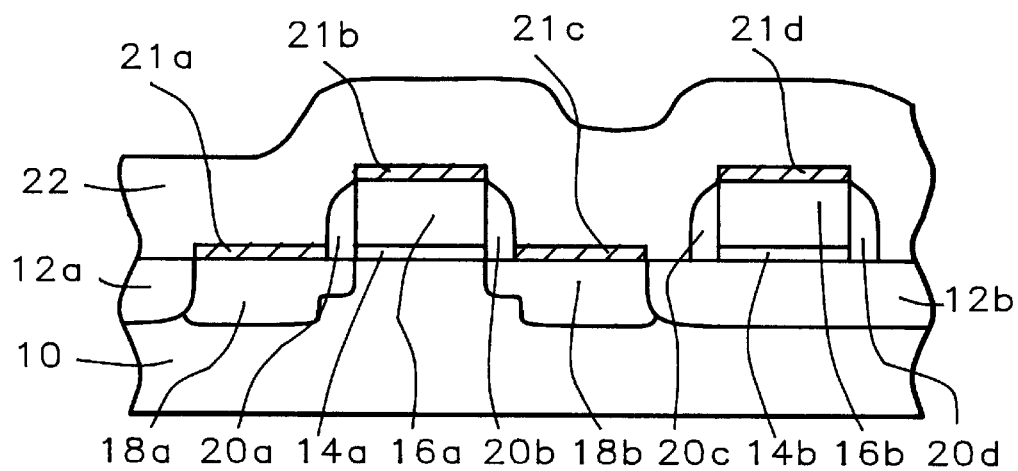
FIG. 5 to FIG. 7 show a series of schematic cross-sectional diagrams illustrating the results of progressive stages in forming within a Field Effect Transistor (FET) for use within an integrated circuit a cobalt silicide polycide gate electrode formed in accord with a second preferred embodiment of the method of the present invention.

Shown in FIG. 5 is a schematic cross-sectional diagram of an integrated circuit otherwise equivalent to the schematic cross-sectional diagram of the integrated circuit illustrated in FIG. 1, with the exception that there has been formed upon the surfaces of the source/drain region 18a, the patterned polysilicon layer 16a, the source/drain region 18b and the patterned polysilicon layer 16b a corresponding series of low encroaching and low silicon substrate consuming metal silicide layers 21a, 21b, 21c and 21d. The low encroaching and low silicon substrate consuming metal silicide layers 21a, 21b, 21c and 21d are preferably formed in a self-aligned fashion through a blanket metal silicide forming metal layer annealing and selective etch removal method analogous to blanket cobalt layer annealing and selective etch removal method employed in forming the patterned self-aligned cobalt silicide layers 24a and 24b within the first preferred embodiment of the method of the present invention, with the exception that there is employed a metal silicide forming metal of a composition and thickness which when annealed upon the source/drain regions 18a and 18b and the patterned polysilicon layers 16a and 16b forms a metal silicide exhibiting low encroachment and low silicon substrate consumption. Although several metal silicide forming metals fulfill these characteristics, tungsten metal and titanium metal are commonly employed within the art and preferred as low encroachment and low silicon substrate consuming metal silicide forming metals.

Thus, for the second preferred embodiment of the method of the present invention, the series of low encroaching and low silicon substrate consuming patterned metal silicide layers 21a, 21b, 21c and 21d is most preferably formed in a self-aligned method employing thermal annealing of a blanket titanium metal layer formed upon the integrated circuit whose schematic cross-sectional diagram is illustrated in FIG. 5 absent the blanket Pre-Metal Dielectric (PMD) layer 22, followed by selective etch removal of unreacted portions of the blanket titanium metal layer. Preferably, the blanket titanium metal layer is from about 200 to about 1000 angstroms thick and the blanket tungsten metal layer or the blanket titanium metal layer is preferably annealed through a Rapid Thermal Annealing (RTA) method at a temperature of from about 600 to about 700 degrees centigrade for a time period of from about 10 to about 30 seconds, although other annealing methods may be employed. Under these conditions, there is typically formed titanium silicide low encroaching and low silicon substrate consuming patterned metal silicide layers 21a, 21b, 21c and 21d of thickness about 200 to about 1500 angstroms each.

Figure 6:
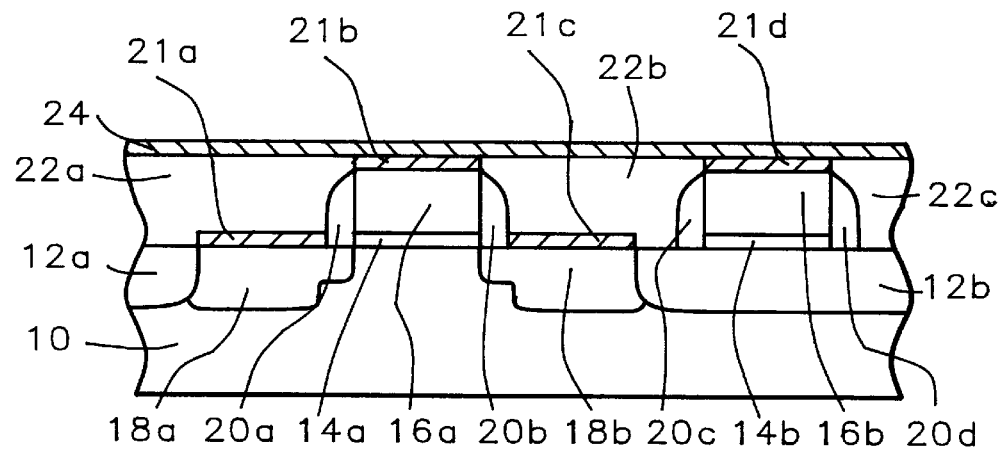
Figure 7:
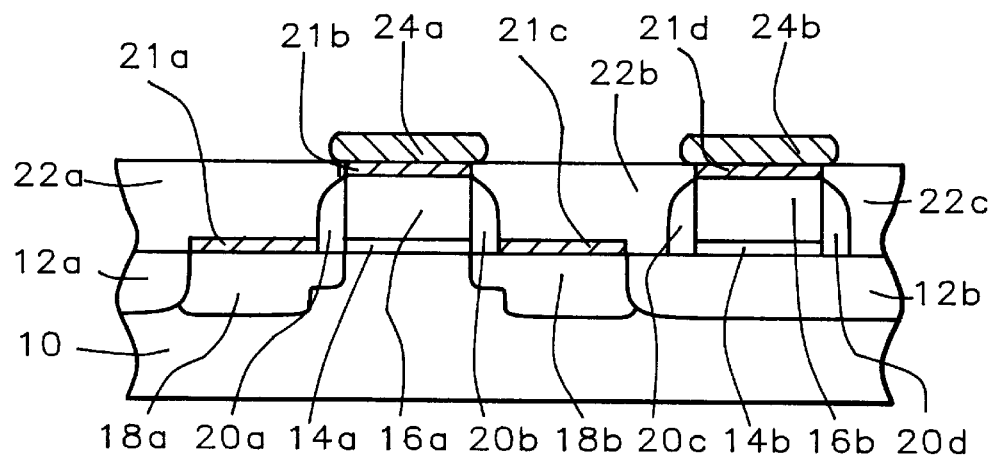

Referring now to FIG. 6 and FIG. 7, there is shown a pair of schematic cross-sectional diagrams illustrating the results of further processing of the integrated circuit whose schematic cross-sectional diagram is illustrated in FIG. 5. The methods, materials, structures and dimensions employed in forming the integrated circuits whose schematic cross-sectional diagrams are illustrated by FIG. 6 and FIG. 7 are otherwise nominally equivalent to the methods, materials, structures and dimensions employed in forming the integrated circuits whose schematic cross-sectional diagrams are illustrated by FIG. 2 and FIG. 3, with the exception of the presence of the series of low encroaching and low silicon substrate consuming patterned metal silicide layers 21a, 21b, 21c and 21d. Although not specifically illustrated, the integrated circuit whose schematic cross-sectional diagram is shown in FIG. 7 may be further processed with the formation of additional dielectric layers and conductor layers to yield an integrated circuit whose schematic cross-sectional diagram is analogous the integrated circuit whose schematic cross-sectional diagram is illustrated in FIG. 4.

Shown specifically within FIG. 6 and FIG. 7 is the results of forming through a self-aligned method analogous to the self-aligned method the results of which are illustrated in FIG. 2 and FIG. 3 the patterned self-aligned cobalt silicide layers 24a and 24b. As shown within FIG. 7, the patterned self-aligned cobalt silicide layers 24a and 24b are formed upon the low encroaching and low silicon substrate consuming metal silicide layers 21b and 21d. Thus, through the second preferred embodiment of the method of the present invention, there is formed a cobalt silicide polycide gate electrode comprising in addition to the patterned polysilicon layer 16a and the patterned self-aligned cobalt silicide layer 24a the intervening low-encroaching and low silicon substrate consuming metal silicide layer 21b. Through the second preferred embodiment of the method of the present invention, there is thus provided within an integrated circuit a Field Effect Transistor (FET) possessing an optimally low contact resistance cobalt silicide polycide gate electrode whose cobalt silicide layer is not susceptible to encroachment upon adjoining insulator spacers or source/drain regions within the integrated circuit within which is formed the Field Effect Transistor (FET). The Field Effect Transistor (FET) simultaneously also possesses low encroaching and low silicon substrate consuming metal silicide layers upon the source/drain regions of the Field Effect Transistor (FET).

As is understood by a person skilled in the art, the preferred embodiments of the method of the present invention are illustrative of the method of the present invention rather than limiting of the method of the present invention. Modifications and revisions may be made to methods, materials, structures and dimensions through which are formed cobalt silicide polycide gate electrodes through the preferred embodiments of the method of the present invention while still providing cobalt silicide polycide gate electrodes formed through a method in accord with the method of the present invention, as defined by the appended claims.

In particular, and as is note above, there may be substituted for the patterned self-aligned cobalt silicide layers 24a and 24b other low resistance and high encroaching metal silicide layers including but not limited to nickel silicide layers, as well as other low resistance and low encroaching metal silicide layers, while still forming within a Field Effect Transistor (FET) for use within an integrated circuit a low resistance polycide gate electrode through the method of the present invention, as defined by the appended claims.

What is claimed is:

1. A method for forming a polycide gate electrode comprising:

providing a semiconductor substrate;

forming upon the semiconductor a patterned polysilicon layer;

forming upon the semiconductor substrate and the patterned polysilicon layer a blanket insulator layer;

planarizing the blanket insulator layer to form a patterned planarized insulator layer while simultaneously exposing the surface of the patterned polysilicon layer; and forming upon the exposed surface of the patterned polysilicon layer a patterned metal silicide layer, the patterned metal silicide layer and the patterned polysilicon layer forming a polycide gate electrode.

2. The method of claim 1 wherein the thickness of the patterned polysilicon layer is from about 1000 to about 4000 angstroms.

3. The method of claim 1 wherein the linewidth of the patterned polysilicon layer is less than about 0.25 microns.

4. The method of claim 1 wherein the blanket insulator layer is a blanket conformal silicon oxide insulator layer formed through a Plasma Enhanced Chemical Vapor Deposition (PECVD) method.

5. The method of claim 1 wherein the patterned metal silicide layer is formed from a metal silicide chosen from the group of metal silicides consisting of cobalt silicide and nickel silicide.

6. The method of claim 1 wherein the patterned metal silicide layer is formed through a self-aligned method through annealing a blanket metal layer formed upon the patterned polysilicon layer and the patterned planarized insulator layer with selective removal of unreacted portions of the blanket metal layer.

7. The method of claim 6 wherein the patterned metal silicide layer is a patterned cobalt silicide layer, the blanket metal layer is a blanket cobalt metal layer and the thickness of the blanket cobalt metal layer is from about 200 to about 1000 angstroms.

8. The method of claim 7 wherein the blanket cobalt metal layer is annealed through a Rapid Thermal Annealing (RTA) method at a temperature of from about 500 to about 900 degrees centigrade for a time period of from about 10 to about 60 seconds.

9. The method of claim 8 wherein the thickness of the patterned cobalt silicide layer is from about 200 to about 1500 angstroms.

10. The method of claim 1 further comprising forming a second patterned metal silicide layer upon the patterned polysilicon layer before forming the blanket insulator layer upon the semiconductor substrate and the patterned polysilicon layer.

11. The method of claim 10 wherein the second patterned metal silicide layer is formed to a thickness of about 200 to about 1500 angstroms.

12. The method of claim 11 wherein the second patterned metal silicide layer is formed through a self-aligned method and the second patterned metal silicide layer is formed from a metal silicide chosen from the group of metal silicides consisting of tungsten silicide and titanium silicide.

13. A method for forming a Field Effect Transistor (FET) for use within an integrated circuit, the Field Effect Transistor (FET) having a polycide gate electrode formed therein, comprising:

providing a semiconductor substrate;

forming upon the semiconductor substrate a gate dielectric layer;

forming upon the gate dielectric layer a patterned polysilicon layer;

forming into the semiconductor substrate while employing the patterned polysilicon layer as a mask a pair of source/drain regions;

forming upon the semiconductor substrate, the gate dielectric layer, the patterned polysilicon layer and the source/drain regions a blanket insulator layer;

planarizing the blanket insulator layer to form a patterned planarized insulator layer while simultaneously exposing the surface of the patterned polysilicon layer; and forming upon the exposed surface of the patterned polysilicon layer a patterned metal silicide layer, the patterned metal silicide layer and the patterned polysilicon layer forming a polycide gate electrode.

14. The method of claim 13 wherein the thickness of the patterned polysilicon layer is from about 1000 to about 4000 angstroms.

15. The method of claim 13 wherein the linewidth of the patterned polysilicon layer is less than about 0.25 microns.

16. The method of claim 13 wherein the blanket insulator layer is a blanket conformal silicon oxide insulator layer formed through a Plasma Enhanced Chemical Vapor Deposition (PECVD) method.

17. The method of claim 13 wherein the patterned metal silicide layer is formed from a metal silicide chosen from the group of metal silicides consisting of cobalt silicide and nickel silicide.

18. The method of claim 13 wherein the patterned metal silicide layer is formed through a self-aligned method through annealing a blanket metal layer formed upon the patterned polysilicon layer and the patterned planarized insulator layer with selective removal of unreacted portions of the blanket metal layer.

19. The method of claim 18 wherein the patterned metal silicide layer is a patterned cobalt silicide layer, the blanket metal layer is a blanket cobalt metal layer and the thickness of the blanket cobalt metal layer is from about 200 to about 1000 angstroms.

20. The method of claim 19 wherein the blanket cobalt metal layer is annealed through a Rapid Thermal Annealing (RTA) method at a temperature of from about 500 to about 900 degrees centigrade for a time period of from about 10 to about 60 seconds.

21. The method of claim 20 wherein the thickness of the patterned cobalt silicide layer is from about 200 to about 1500 angstroms.

22. The method of claim 13 further comprising forming a second patterned metal silicide layer upon the patterned polysilicon layer before forming the blanket insulator layer upon the semiconductor substrate, the gate dielectric layer, the patterned polysilicon layer and the source/drain regions.

23. The method of claim 22 wherein the second patterned metal silicide layer is formed to a thickness of about 200 to about 1500 angstroms.

24. The method of claim 23 wherein the second patterned metal silicide layer is formed through a self-aligned method and the second patterned metal silicide layer is formed from a metal silicide chosen from the group of metal silicides consisting of tungsten silicide and titanium silicide.

25. The method of claim 13 further comprising forming a series of additional semiconductor structures within and upon the semiconductor substrate, thus forming the Field Effect Transistor (FET) within an integrated circuit.

* * * * *